United States Patent
Jovanovich

(10) Patent No.: US 7,461,181 B2
(45) Date of Patent: Dec. 2, 2008

(54) PROGRAMMING OF CONFIGURATION SERIAL EEPROM VIA AN EXTERNAL CONNECTOR

(75) Inventor: Alan Frank Jovanovich, Costa Mesa, CA (US)

(73) Assignee: Emulex Design & Manufacturing Corporation, Costa Mesa, CA (US)

( * ) Notice: Subject to any disclaimer, the term of this patent is extended or adjusted under 35 U.S.C. 154(b) by 497 days.

(21) Appl. No.: 11/114,338

(22) Filed: Apr. 25, 2005

(65) Prior Publication Data

US 2006/0242437 A1    Oct. 26, 2006

(51) Int. Cl.
  G06F 3/00    (2006.01)
  G06F 13/00   (2006.01)
  H04L 12/50   (2006.01)
  H04Q 11/00   (2006.01)

(52) U.S. Cl. .................. 710/29; 710/301; 710/305; 370/357; 370/360

(58) Field of Classification Search .............. 710/29
See application file for complete search history.

(56) References Cited

U.S. PATENT DOCUMENTS

| | | | | |
|---|---|---|---|---|
| 5,243,640 A | * | 9/1993 | Hadley et al. | 455/426.1 |
| 6,141,704 A | * | 10/2000 | Huang | 710/15 |
| 6,892,248 B2 | * | 5/2005 | Thayer | 710/2 |
| 7,085,545 B2 | * | 8/2006 | Nitta | 455/126 |
| 2004/0135620 A1 | * | 7/2004 | Pezzani | 327/453 |
| 2005/0012116 A1 | * | 1/2005 | Lim et al. | 257/199 |
| 2006/0065743 A1 | * | 3/2006 | Fruhauf | 235/492 |
| 2006/0085699 A1 | * | 4/2006 | Hathorn et al. | 714/56 |

FOREIGN PATENT DOCUMENTS

TW            094109773     *   4/2005

OTHER PUBLICATIONS

English Translation of TW-094109773, Apr. 2005.*

* cited by examiner

Primary Examiner—Niketa I. Patel
Assistant Examiner—Zachary K Huson
(74) Attorney, Agent, or Firm—Morrison & Foerster LLP

(57) ABSTRACT

The present invention is directed to providing configuration data to an EEPROM within a sealed enclosure without having to open the enclosure, using a Test Interface Card (TIC) connected to a particular external multi-use port on the enclosure. The present invention is generally applicable to any sealed enclosure containing a device that receives information through an internal serial bus, where the enclosure includes ports that have both high speed, low voltage connections and lower speed DC connections. DC blocking capacitors are placed on the high speed lines, and when a TIC is inserted into the multi-use port, a voltage detection circuit coupled to the high speed connections detects a DC control voltage, tri-states a Switch On a Chip (SOC) and configures switches to connect the lower speed connections to the serial bus and an EEPROM so that the TIC can supply new configuration data to the EEPROM.

18 Claims, 4 Drawing Sheets

PROGRAMMING OF CONFIGURATION SERIAL EEPROM VIA AN EXTERNAL CONNECTOR

BACKGROUND OF THE INVENTION

1. Field of the Invention

The present invention relates, generally, to the configuration of hardware in storage devices, and in particular embodiments, to the programming of a configuration serial Electrically Erasable Programmable Read-Only Memory (EEPROM) via an external connector after the EEPROM has been installed in a sealed switch box.

2. Description of Related Art

Non-blocking and blocking crossbar switches for storage systems are generally implemented in several configurations. In one configuration, the crossbar switch is contained within an enclosure containing a number of drives, and the enclosure is referred to as a Switched Bunch Of Disks (SBOD). In another configuration, the crossbar switch is contained in an enclosure referred to as a root switch, which connects externally to a number of arbitrated loops of drives known as Just a Bunch Of Disks (JBODs). In yet another configuration, a root switch is connected to SBODs in a fully switched architecture.

FIG. 1 illustrates an exemplary conventional system environment 100 utilizing crossbar switches employed within SBODs. In FIG. 1, an initiator such as a host computer 102, including an Input/Output (I/O) controller such as a Host Bus Adapter (HBA) 104, is connected to a storage system 106 via an Ethernet or Local Area Network (LAN) or Storage Area Network (SAN) 108 implementing a protocol such as Fibre Channel (FC). Storage system 106 may include one or more storage controllers such as Redundant Array of Independent Disks (RAID) controllers 112, and mass storage capability such as a RAID 110, which may include multiple SBODs 114, each containing multiple disk drives 132, a crossbar switch 124, a processor 126, and a variety of storage enclosure hardware 128. The crossbar switch 124 provides ports for direct connections to each of the drives 132 within each SBOD 114.

FIG. 2 illustrates an exemplary switch 200 for use in the system environment of FIG. 1, or in a fully switched environment (not shown). Switch 200 includes a number of ports 202. Ports 202 may employ Small Form Factor (SFF) connectors 206, which are hot-swappable, high-speed, physically compact connectors for receiving Small Form-factor Pluggable (SFP) optical or electrical modular transceivers 204. Because SFP transceivers 204 can be easily interchanged, electro-optical or fiber optic networks can be easily upgraded and maintained. Connected to the ports 202 is a non-blocking crossbar switch 208, referred to herein as a Switch On a Chip (SOC). The SOC 208 needs to be configured with configuration data. One example of configuration data that can be utilized by the SOC 208 is the identification of unused ports, which can be powered down to conserve power and reduce noise. Connected to the SOC 208 is an EEPROM 210, which stores basic configuration information that the SOC 208 reads during power-up initialization. The SOC 208 and EEPROM 210 may be connected by a three conductor serial bus (clock, data, ground) implementing a protocol such as the Inter-Integrated Circuit (I$^2$C) protocol 212. When the SOC 208 powers up or is re-booted, it reads this basic configuration information from the EEPROM 210, which enables the SOC 208 to begin operating.

The SOC 208 may be managed by a processor 214 within the switch 200. In a managed configuration, the processor 214 may be connected to a separate serial port 216 for external programming and may directly store new configuration information in the EEPROM 210 using the serial bus 212. However, if the SOC 208 is unmanaged (no processor 214 or port 216), another means must be found to store new configuration data in the EEPROM 210.

In conventional unmanaged switches 200, configuration data may be programmed into the EEPROM 210 prior to its installation into the switch 200, or the EEPROM 210 may be installed into the switch 200 in a blank state, and then programmed using a special connector or pads prior to sealing the switch enclosure. Once the switch enclosure is sealed or closed, it is not possible to re-program the EEPROM 210 with new configuration data unless the switch enclosure is physically removed from the storage system, unsealed, and then either the special connector is accessed or the EEPROM 210 is physically removed from the switch 200 and reconfigured or replaced. Either of these methods is costly and inefficient.

Therefore, there is a need to be able to store new configuration data in the EEPROM 210 without having to unseal or open the switch enclosure or even remove the enclosure from the storage system.

SUMMARY OF THE INVENTION

The present invention is directed to providing serial data to a device within a sealed enclosure without having to open the enclosure, using a Test Interface Card (TIC) connected to a particular external multi-use port on the enclosure. The TIC may be connected to a management interface such as a personal computer (PC) through an I$^2$C dongle. Embodiments of the present invention are generally applicable to any sealed enclosure containing a device that receives information through an internal serial bus, where the enclosure includes ports that have both high speed, low voltage connections and direct current (DC) connections. It should be noted that although the details of a switch enclosure and the programming of configuration data into an EEPROM are described herein for purposes of explanation only, embodiments of the present invention are not so limited.

One of the main advantages of embodiments of the present invention is that enclosures such as switches can be assembled and sealed, and the configuration EEPROM need not be programmed until a later time (e.g. just prior to shipping). In addition, if new configuration data needs to be loaded into a storage enclosure that is already integrated into a storage system, the special configuration port may be used without having to pull the enclosure off the rack.

To enable the writing of configuration data into an EEPROM through an external port on a switch or other enclosure, the port must have its connectivity modified. The switch or other storage enclosure includes an SOC connected to the port via high speed microwave transmission lines carrying signals with a specified peak-to-peak voltage limit and lower speed control lines carrying DC signals with a different specified voltage range, and connected to the EEPROM through a serial bus. DC blocking capacitors are inserted into a selected pair of receive (Rx) high speed transmission lines so that these lines can receive a DC control voltage without damaging the SOC. A DC control voltage greater than the peak-to-peak voltage limit of the normal signaling can be applied and clearly distinguished and detected apart from the normal signaling.

In addition, switches are inserted into the serial bus. The switches are coupled to the serial bus connected to the SOC, the lower speed control lines, and the serial bus, and are able to selectively apply either the lower speed control lines or the serial bus from the SOC to the EEPROM. When the switches connect the serial bus to the EEPROM, the SOC is able to communicate normally with the EEPROM. When the switches connect the lower speed control lines to the EEPROM, the EEPROM may be configured by the TIC via the port.

One wire of the Rx high speed transmission line is connected to a first input of a comparator via a resistor-divider network comprised of a high impedance element, which produces an impedance of roughly 10 times the impedance of the Rx high speed lines so that the comparator will have a negligible effect on the Rx high speed transmission line. (Note that in alternative embodiments, both wires of the Rx high speed transmission line could be used in a differential configuration.) The other input of the comparator is biased to a certain DC reference voltage (e.g. 4V) via a resistor or divider. The comparator output is connected to the control inputs of the switches and controls their operation, and is also connected to the SOC through a tri-state control line and is capable of placing the SOC in a tri-state mode in which it is disabled.

The port may comprise a connector such as an SFF connector. In normal operation, a transceiver such as an SFP optical transceiver is inserted into the SFF connector of the port, and high-speed signals with a specified peak-to-peak voltage limit (e.g. 2V p-p) are communicated to the SOC via high speed microwave transmission lines. Because the signals are high speed, the DC blocking capacitors appear as short circuits. In addition, because the high speed microwave transmission lines are carrying signals with a peak-to-peak voltage less than the reference voltage, the comparator output is held low, which configures the switches to connect the serial bus from the SOC to the EEPROM, and keeps the SOC in normal operation.

However, when an end user wants to read and/or configure the EEPROM, the SFP transceiver inserted into the SFF connector is first removed. After the SFP transceiver is removed, the TIC is inserted into the SFF connector. The TIC may contain a DC power source (e.g. 6V). Although writing configuration data to an EEPROM is described herein, embodiments of the present invention may be utilized to send any type of serial data to a processor or other device coupled to the internal serial bus.

Once the TIC is inserted into the SFF connector, a DC voltage, which may be produced by the DC power source, is applied to the Rx high speed transmission line connected to the high impedance element. Because this DC voltage, which appears at the first input of the comparator, is selected to be greater than the reference voltage, the comparator output changes state, which configures the switches to connect the lower speed control lines to the EEPROM, and places the SOC in a tri-state mode via a tri-state control line. The DC blocking capacitors prevent the DC voltage from reaching the SOC and damaging it. The TIC can now read data from the EEPROM or program the EEPROM by using a processor to send new configuration information to the EEPROM using the lower speed control lines. Note that because the SOC has been tri-stated, it is unaffected by the lower speed control lines and any other inputs.

After a new configuration has been stored into EEPROM, the TIC can be removed from the SFF connector. Because the DC power source is no longer being applied to the Rx high speed transmission line connected to the high impedance element, a low voltage appears on comparator output, which in turn causes the tri-state control line to be de-asserted, returning the SOC to normal operation, and causes the switches to connect the serial bus to the EEPROM again. The TIC can be removed from the SFF connector, and the regular SFP transceiver can be once again plugged into the SFF connector. Once the EEPROM has been reconfigured, the SOC may need to run through a power-on reset cycle in order to read the new configuration data from the EEPROM and begin using it.

It should be understood that the use of a port to control the serial bus and program the EEPROM as described above is not only beneficial because it avoids having to open up the enclosure and re-program the EEPROM, but also because there may not be enough room for another connector when external enclosure space is at a premium. Therefore, configuring one port for programming the EEPROM in addition to its regular use makes efficient use of space. In addition, if the serial bus connected to the EEPROM is an I²C bus, there is no external interface defined for the I²C protocol because it is an on-board standard, and thus a dedicated external I²C connector cannot be used. Moreover, even if a dedicated external connector could be used, the cost of such a connector (which would have to be sealed meet emissions requirements) would far outweigh the special circuitry described above.

DETAILED DESCRIPTION OF PREFERRED EMBODIMENTS

In the following description of preferred embodiments, reference is made to the accompanying drawings that form a part hereof, and in which is shown by way of illustration specific embodiments in which the invention may be practiced. It is to be understood that other embodiments may be utilized and structural changes may be made without departing from the scope of the preferred embodiments of the present invention.

Embodiments of the present invention are directed to providing serial data to a device within a sealed enclosure without having to open the enclosure, using a test interface card (TIC) connected to a particular external multi-use port on the enclosure. The TIC may be connected to a management interface such as a personal computer (PC) through an I²C dongle. Embodiments of the present invention are generally applicable to any sealed enclosure containing a device that receives information through an internal serial bus, where the enclosure includes ports that have both high speed, low voltage connections and lower speed DC connections. It should be noted that although the details of a switch enclosure and the programming of configuration data into an EEPROM are described herein for purposes of explanation only, embodiments of the present invention are not so limited.

Figure 1:
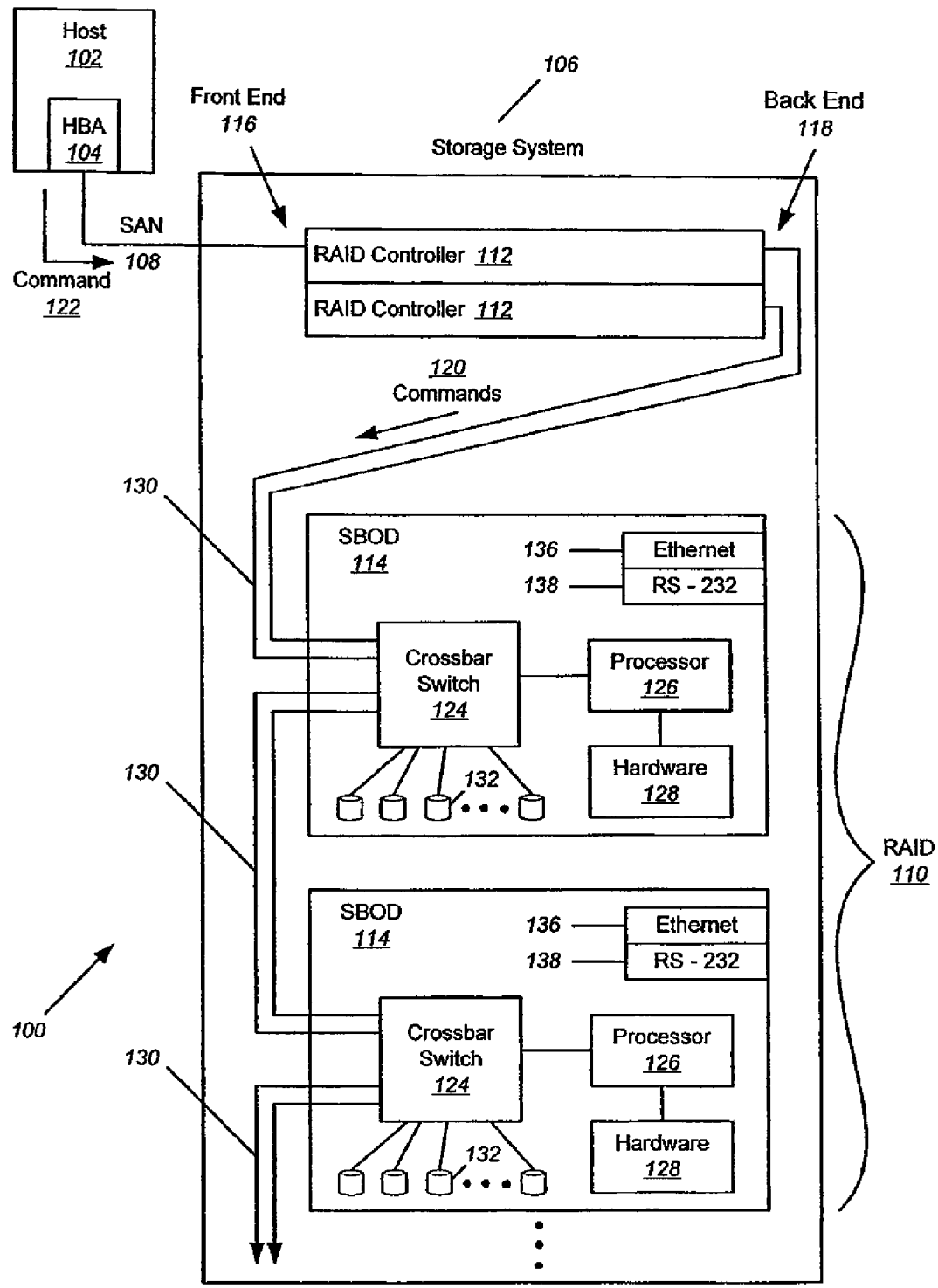
FIG. 1 illustrates an exemplary conventional system environment including an SBOD configuration of storage devices.
Figure 2:
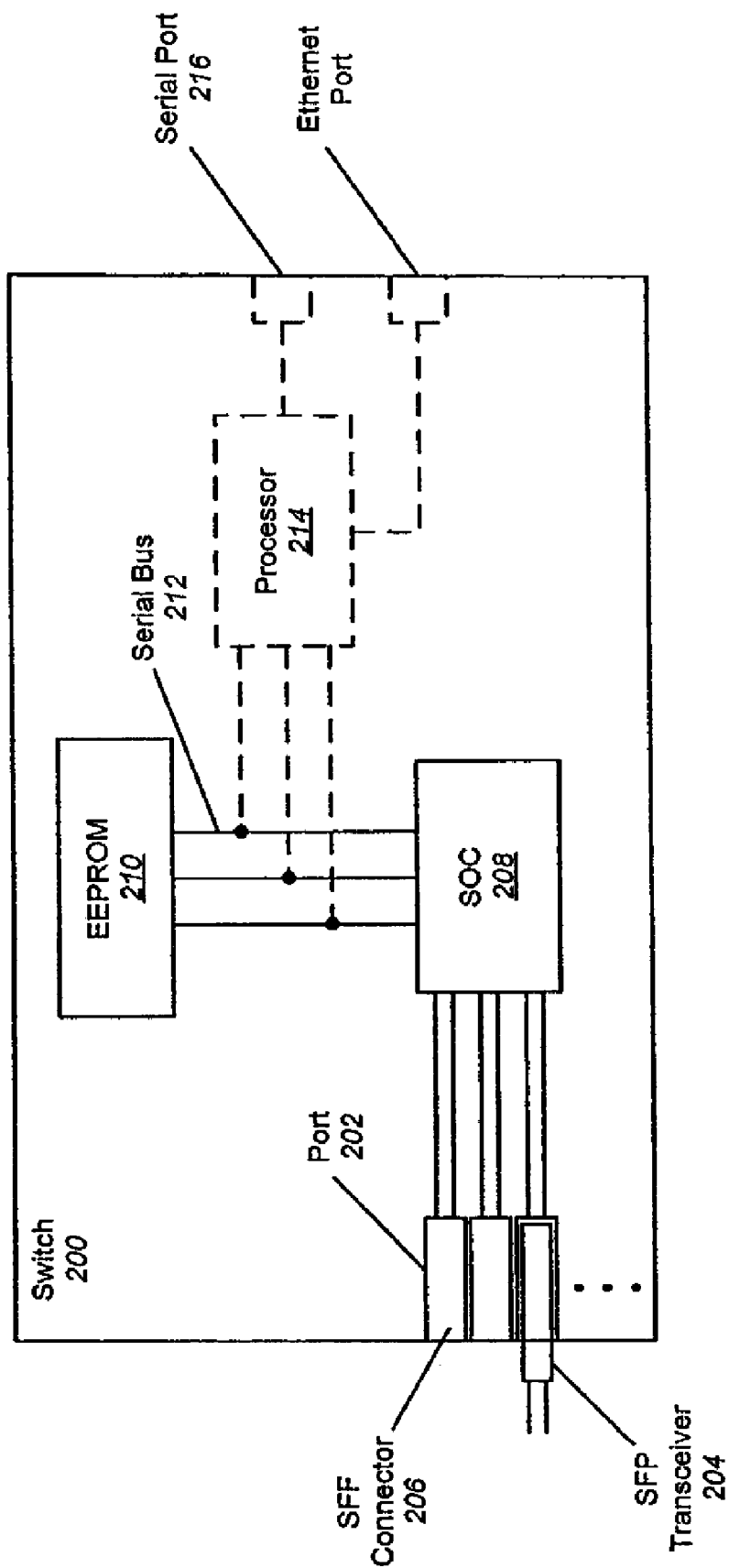
FIG. 2 illustrates an exemplary switch for use in the system environment of FIG. 2 or in a fully switched environment, showing an EEPROM that stores configuration data for the SOC.
Figure 3:
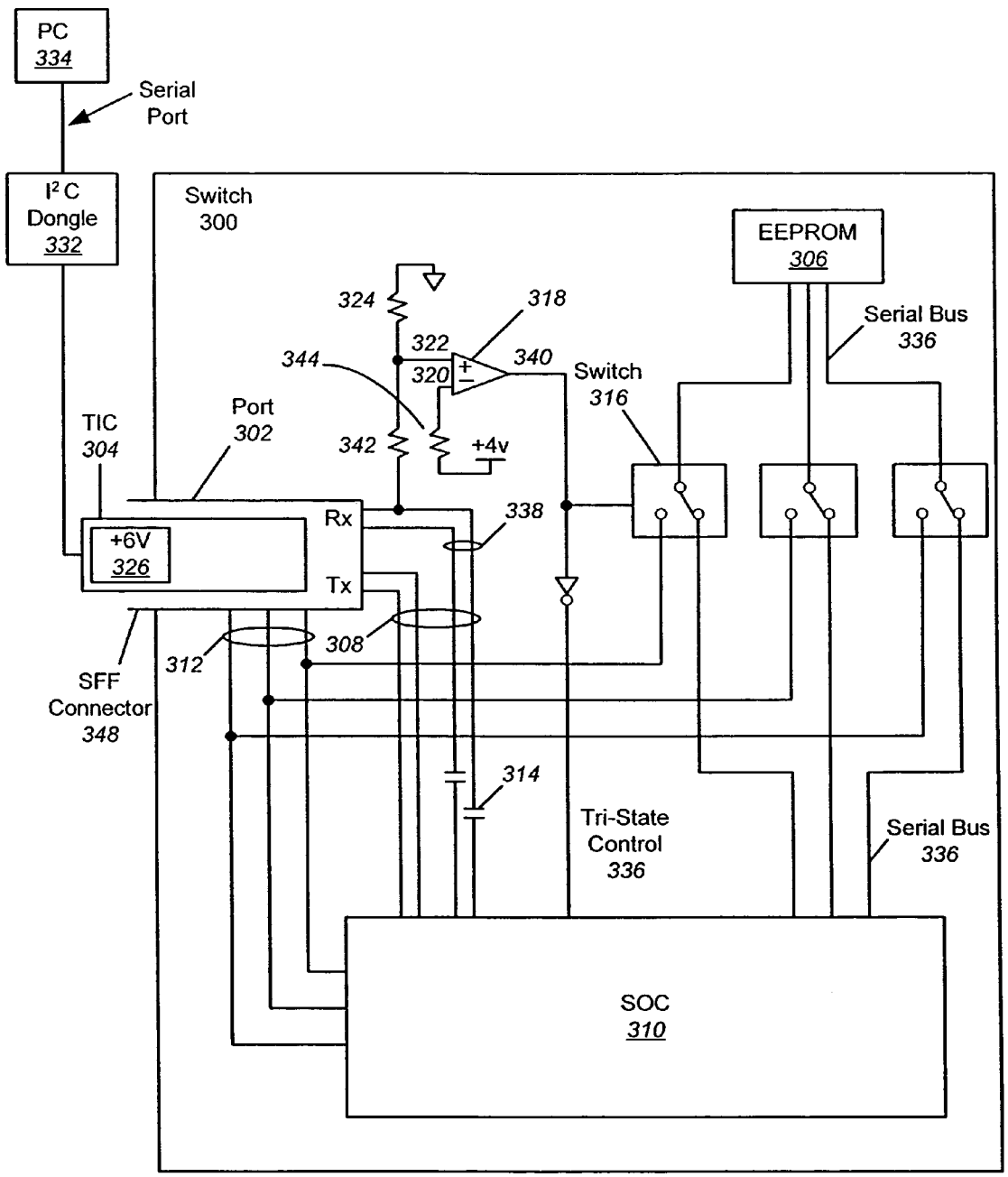
FIG. 3 illustrates a switch having a port whose connectivity has been modified for enabling an EEPROM to be configured using a serial bus through the port by a TIC according to embodiments of the present invention.

FIG. 3 illustrates a switch 300 having a port 302 whose connectivity has been modified for enabling an EEPROM 306 to be configured using a serial bus through the port 302 by a TIC 304 according to embodiments of the present invention. Note that only one port in the root switch 300 needs to be modified in the manner described in FIG. 3. The switch 300 includes SOC 310 connected to port 302 via high speed microwave lines 308 carrying signals with a specified peak-to-peak voltage limit (e.g. 2V p-p), and also via lower speed control lines 312 carrying Direct Current (DC) signals with a different specified voltage range (e.g. 0-3V). SOC 310 is also connectable to the EEPROM 306 through a serial bus 336 such as an $I^2C$ bus, which may include separate clock, data and ground lines.

To modify port 302 so that it can receive a TIC 304 to configure the EEPROM 306 according to embodiments of the present invention, DC blocking capacitors 314 are inserted into a selected pair of receive (Rx) high speed transmission lines 338 so that these lines can receive a DC control voltage without damaging the SOC 310. The high speed transmission lines 338 are chosen because of the relatively low specified peak-to-peak voltage limit of their normal signaling. A DC control voltage greater than the peak-to-peak voltage limit of the normal signaling can be applied and clearly distinguished and detected apart from the normal signaling. In addition, switches 316 are inserted into the serial bus 336. Switches 316, although illustrated symbolically in FIG. 3, may be electronic semiconductor switches with high impedance inputs such as Complementary Metal Oxide Semiconductor (CMOS) switches. The switches 316 are coupled to the serial bus 336 connected to the SOC 310, the lower speed control lines 312, and the serial bus 336 connected to the EEPROM 306, and are able to selectively apply either the lower speed control lines 312 or the serial bus 336 from the SOC 310 to the EEPROM 306. When the switches 316 connect the serial bus 336 to the EEPROM 306, the SOC 310 is able to communicate normally with the EEPROM 306. When the switches 316 connect the lower speed control lines 312 to the EEPROM 306, the EEPROM 306 may be configured by the TIC 304 via port 302. Note that the lower speed control lines 312 are used for configuring the EEPROM 306 rather than other high speed microwave lines 308, because the performance of the high speed microwave lines may be adversely affected by path geometries such as extra traces and trace lengths.

One wire of the Rx high speed transmission line 338 is connected to a first input 322 of a comparator 318 via a resistor-divider network comprised of a high impedance resistive element 342 and a resistor 324, which produces an impedance of roughly 10 times the impedance of the Rx high speed lines 338 so that the comparator 318 will have a negligible effect on the Rx high speed transmission line 338. The other input 320 of the comparator 318 is biased to a certain DC reference voltage (e.g. 4V) via a resistor 344. In alternative embodiments, if the Rx high speed transmission line 338 is a differential pair, the differential voltage between the pair may be applied to both inputs 320 and 322 of the comparator 318. The comparator output 340 is connected to the control inputs of switches 316 and controls their operation, and is also connected to SOC 310 through tri-state control line 346 and is capable of placing SOC 310 in a tri-state mode in which it is disabled. Although a comparator circuit is shown in FIG. 3, any other voltage detection circuit well-understood by those skilled in the art may be used on the Rx high speed transmission line 338 to detect a control voltage outside the limits of the normal signaling physical level specification.

Port 302 may comprise a connector such as an SFF connector 348. In normal operation, a transceiver such as an SFP optical transceiver is inserted into the SFF connector 348 of port 302, and high-speed signals with a specified peak-to-peak voltage limit (e.g. 2V p-p) are communicated to SOC 310 via high speed microwave lines 308. Because the signals are AC, the DC blocking capacitors 314 appear as short circuits. In addition, because the high speed microwave transmission lines 308 are carrying signals with a peak-to-peak voltage less than the reference voltage at 320, the comparator output 340 is held low, which configures switches 316 to connect the serial bus 336 from the SOC 310 to the EEPROM 306, and keeps the SOC 310 in normal operation.

However, when an end user wants to read and/or configure the EEPROM 306 according to embodiments of the present invention, the SFP transceiver inserted into the SFF connector 348 is first removed (or an unused port may be utilized, in which case there is nothing to remove). Note that prior to removing the SFP transceiver and beginning the procedure of disabling the switch 300, traffic may be re-routed to another switch, and router tables and other statistical information stored in the switch 300 may optionally be re-routed to another switch so that this information is not lost and the flow of information is not interrupted.

After the SFP transceiver is removed, the TIC 304 is inserted into the SFF connector 348. The TIC 304 may contain a DC power source 326 (e.g. 6V). Alternatively or additionally, the TIC 304 may be connected to an $I^2C$ dongle 332, which in turn may be plugged into a PC 334 via a serial port for executing code to step through the configuration addresses in the EEPROM 306 and writing new configuration data into those addresses. The TIC 304 may alternatively have a wireless connection to a programming interface. Although writing configuration data to an EEPROM is described herein, embodiments of the present invention may be utilized to send any type of serial data to a processor or other device coupled to the internal serial bus 336.

Once the TIC 304 is inserted into the SFF connector 348, a DC voltage, which may be produced by DC power source 326, is applied to the Rx high speed transmission line connected to the high impedance element 342. Because this DC voltage, which appears at the first input 322 of the comparator 318, is selected to be greater than the voltage at input 320 of comparator 318, the comparator output 340 changes state, which configures switches 316 to connect the lower speed control lines 312 to the EEPROM 306, and places SOC 310 in the tri-state mode via tri-state control line 346. The DC blocking capacitors 314 prevent the DC voltage from reaching the SOC 310 and damaging it. In this configuration, the EEPROM 306 is essentially directly connected to TIC 304 through lower speed control lines 312, and is disconnected from SOC 310. The TIC 304 can now read data from the EEPROM 306 or program the EEPROM 306 by using processor 330 or PC 334 to send new configuration information to the EEPROM 306 using the lower speed control lines 312. Note that because SOC 310 has been tri-stated, it is unaffected by the lower speed control lines 312 and any other inputs.

After a new configuration has been stored into EEPROM 306, the TIC 304 can be removed from the SFF connector 348. Because the DC power source 326 is no longer being applied to the Rx high speed transmission line connected to the high impedance element 342, first input 322 of the comparator 318 goes low, and a low voltage appears on comparator output 340, which in turn causes the tri-state control line 342 to be de-asserted, returning the SOC 310 to normal operation, and causes switches 316 to connect the serial bus 336 to the EEPROM 306 again. The TIC 304 can be removed from the SFF connector 348, and the regular SFP transceiver can be once again plugged into the SFF connector 348. Once the EEPROM 306 has been reconfigured, the SOC 310 may need to be re-booted or run through a power-on reset cycle in order to read the new configuration data from the EEPROM 306 and begin using it.

In an alternative to the embodiments of the present invention described above, a window comparator could be used along with additional switches, so that depending on the DC voltage applied to the Rx high speed transmission line 338, various comparator outputs could be selectively asserted and the switches could be configured so that serial data supplied by the TIC 304 could alternatively program an EEPROM, provide serial data to a processor, or configure other devices connected to the serial bus 336.

It should be understood that the use of a port to control the serial bus 336 and program the EEPROM 306 as described above is not only beneficial because it avoids having to open up the enclosure and re-program the EEPROM, but also because there may not be enough room for another connector when external enclosure space is at a premium. Therefore, configuring one port for programming the EEPROM 306 in addition to its regular use makes efficient use of space. In addition, if the serial bus connected to the EEPROM is an I²C bus, there is no external interface defined for the I²C protocol because it is an on-board standard, and thus a dedicated external I²C connector cannot be used. Moreover, even if a dedicated external connector could be used, the cost of such a connector (which would have to be sealed meet emissions requirements) would far outweigh the special circuitry described above.

Figure 4:
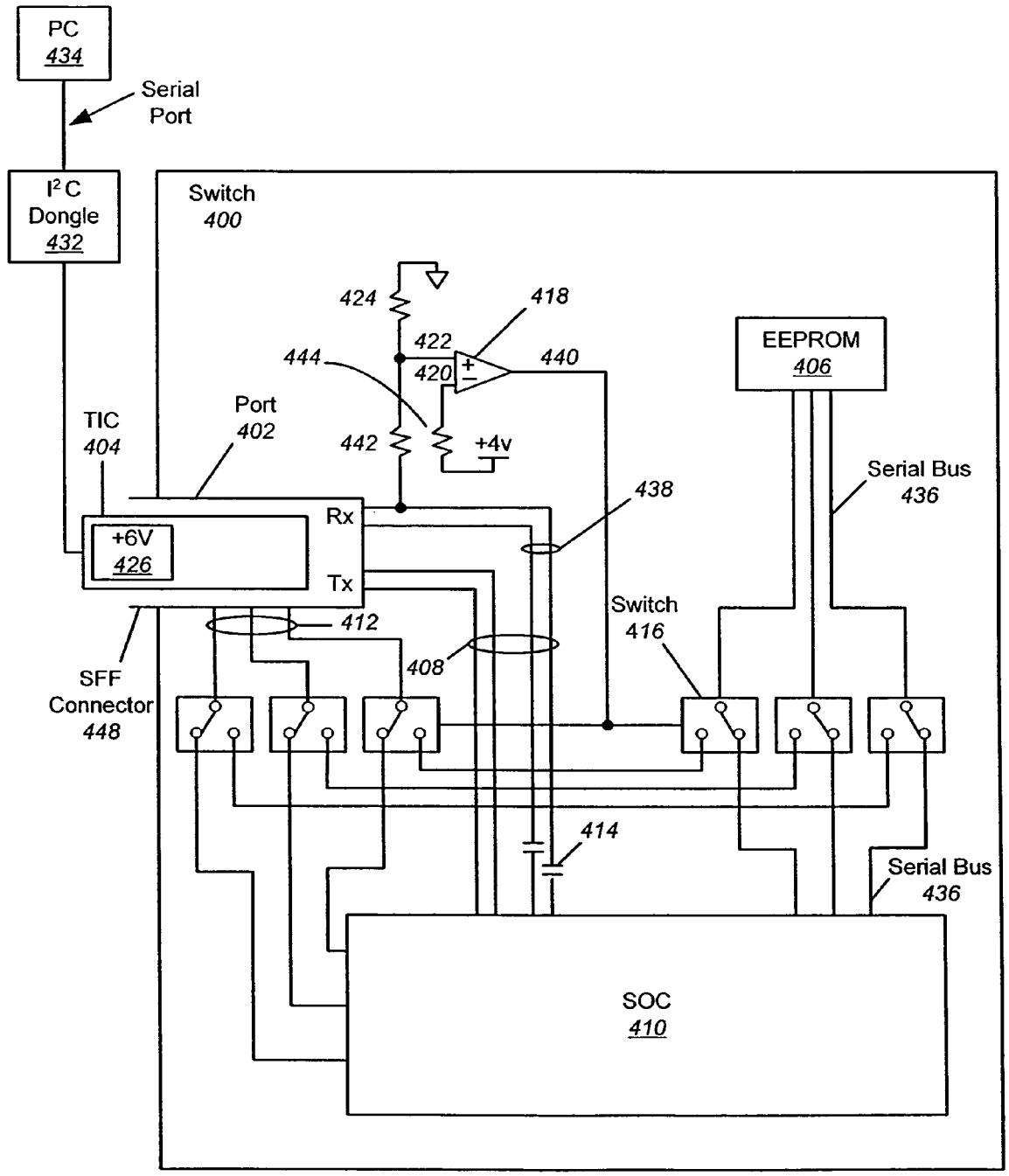
FIG. 4 illustrates a switch having a port whose connectivity has been modified for enabling an EEPROM to be configured through the port by a TIC while the SOC continues to run according to another embodiment of the present invention.

FIG. 4 illustrates a switch 400 having a port 402 whose connectivity has been modified for enabling an EEPROM 406 to be configured through the port 402 by a TIC 404 according to another embodiment of the present invention. The embodiment of FIG. 4 is similar to the embodiment of FIG. 3, with some key differences. In FIG. 4, comparator output 440 is not connected to SOC 410 via a tri-state control line and does not tri-state SOC 410 when comparator output 440 goes high. In addition, switches 442 are inserted into lower speed control lines 412, and comparator output 440 controls switches 442 such that the lower speed control lines 412 are connected to switches 416 (and ultimately to EEPROM 406) when comparator output 440 goes high. With these changes, SOC 410 can continue to operate normally while EEPROM 406 is reconfigured by TIC 404. Preferably, port 402 is unused so that no device access is lost when TIC 404 is connected to port 402 and SOC 410 continues to run.

Although the present invention has been fully described in connection with embodiments thereof with reference to the accompanying drawings, it is to be noted that various changes and modifications will become apparent to those skilled in the art. Such changes and modifications are to be understood as being included within the scope of the present invention as defined by the appended claims.

What is claimed is:

1. In an enclosure containing a first device for storing data, a second device coupled to the first device through a serial bus for accessing the stored data, the stored data configuring the second device, and a port coupled to the second device via high speed lines and lower speed lines for communicating with the second device, a system for enabling data to be stored in the first device through the port, comprising:
    DC blocking capacitors inserted into the high speed lines;
    first one or more switches coupled to the lower speed lines and the serial bus for selectably connecting either the lower speed lines or the second device to the first device through the serial bus; and
    a voltage detection circuit coupled to at least one of the high speed lines and the first one or more switches for detecting a control voltage on the high speed lines that exceeds a normal signaling voltage and configuring the first one or more switches to connect the lower speed lines to the first device to enable data to be applied at the port and stored in the first device.

2. The system as recited in claim 1, the voltage detection circuit coupled to the second device for tri-stating the second device upon detection of the control voltage.

3. The system as recited in claim 1, further comprising a test interface card (TIC) connectable into the port for applying the control voltage to the high speed lines and applying data to the lower speed lines.

4. The system as recited in claim 3, the TIC comprising:
    a control voltage source connectable to the high speed lines at the port for applying the control voltage to the high speed lines.

5. The system as recited in claim 3, further comprising:
    a dongle couplable to the TIC though a serial interface for communicating with the TIC; and
    a computer couplable to the dongle for controlling the application of the control voltage to the high speed lines and the application of data to the lower speed lines by the TIC.

6. The system as recited in claim 1, further comprising:
    second one or more switches coupled to the voltage detection circuit and inserted into the lower speed lines between the port and the second device and between the port and the first one or more switches for selectably connecting the lower speed lines to the first device through the serial bus while disconnecting the lower speed lines from the second device.

7. A storage system comprising the system of claim 1.

8. A storage area network (SAN) comprising the storage system of claim 7.

9. A switch, comprising:
    a first device coupled to a serial bus for storing data;
    a second device coupled to the serial bus for accessing the stored data,
    wherein the stored data configures the second device and the second device is within an enclosure;
    first one or more switches coupled to the serial bus for controlling a flow of data between the first device and the second device though the serial bus;
    a port coupled to the second device via high speed lines and lower speed lines for communicating with the second device, the lower speed lines also being coupled to the one or more switches;
    DC blocking capacitors inserted into the high speed lines; and
    a voltage detection circuit coupled to at least one of the high speed lines and the first one or more switches for detecting a control voltage on the high speed lines that exceeds a normal signaling voltage and configuring the first one or more switches to connect the lower speed lines to the first device to enable data to be applied at the port and stored in the first device.

10. The switch as recited in claim 9, the voltage detection circuit coupled to the second device for tri-stating the second device upon detection of the control voltage.

11. The switch as recited in claim 9, further comprising:
    second one or more switches coupled to the voltage detection circuit and inserted into the lower speed lines between the port and the second device and between the port and the first one or more switches for selectably connecting the lower speed lines to the first device through the serial bus while disconnecting the lower speed lines from the second device.

12. A storage system comprising the switch of claim 9.

13. A storage area network (SAN) comprising the storage system of claim 12.

14. In an enclosure containing a first device for storing data, a second device coupled to the first device through a serial bus for accessing the stored data, the stored data configuring the second device, and a port coupled to the second device via high speed lines and lower speed lines for communicating with the second device, a method for enabling data to be stored in the first device though the port, the method comprising:

inserting DC blocking capacitors into the high speed lines;

inserting first one or more switches into the serial bus between the first device and the second device;

coupling the lower speed lines to the first one or more switches for selectably connecting either the lower speed lines or the second device to the first device through the serial bus; and detecting a control voltage on the high speed lines that exceeds a normal signaling voltage and configuring the first one or more switches to connect the lower speed lines to the first device to enable data to be applied at the port and stored in the first device.

15. The method as recited in claim 14, further comprising tri-stating the second device upon detection of the control voltage.

16. The method as recited in claim 14, further comprising connecting a test interface card (TIC) to the port for applying the control voltage to the high speed lines and applying data to the lower speed lines.

17. The method as recited in claim 16, further comprising:
coupling a dongle to the TIC through a serial interface for communicating with the TIC; and
coupling a computer to the dongle for controlling the application of the control voltage to the high speed lines and the application of data to the lower speed lines by the TIC.

18. The method as recited in claim 14, further comprising:
inserting second one or more switches into the lower speed lines between the port and the second device and between the port and the first one or more switches and coupling the second one or more switches to the voltage detection circuit for selectably connecting the lower speed lines to the first device through the serial bus while disconnecting the lower speed lines from the second device.

* * * * *